United States Patent
Takeshita (10) Patent No.: US 8,624,286 B2
(45) Date of Patent: Jan. 7, 2014

(54) SEMICONDUCTOR DEVICE (75) Inventor: Atsushi Takeshita, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/600,066

(22) Filed: Aug. 30, 2012

(65) Prior Publication Data

US 2013/0240913 A1 Sep. 19, 2013

(30) Foreign Application Priority Data

Mar. 19, 2012 (JP) ................................ 2012-062636

(51) Int. Cl.
*H01L 23/34* (2006.01)

(52) U.S. Cl.
USPC ............... 257/98; 257/99; 257/100; 257/723; 257/724; 257/787

(58) Field of Classification Search
USPC ........... 257/432–433, 98–100, 787, 723–724; 385/15, 8, 39
See application file for complete search history.

(56) References Cited

U.S. PATENT DOCUMENTS

| 4,047,045 A * | 9/1977 | Paxton et al. ................. 250/551 |
| 5,753,929 A * | 5/1998 | Bliss ............................. 250/551 |
| 2003/0189213 A1 | 10/2003 | Igaki et al. |

FOREIGN PATENT DOCUMENTS

| JP | 10-070304 A | 3/1998 | |
| JP | 2002237615 A | 8/2002 | |
| JP | 2008235599 A | 10/2008 | |
| JP | 2009071190 A | 4/2009 | |
| JP | 2010114141 A | 5/2010 | |
| WO | WO2010/120651 | * 10/2010 | ............. G01B 11/00 |

* cited by examiner

*Primary Examiner* — Eugene Lee

(74) *Attorney, Agent, or Firm* — Patterson & Sheridan, LLP (57) ABSTRACT

According to an embodiment, a semiconductor device including a first body molded with a first resin, a second body molded with the first resin, and a third body molded with a second resin. The first body includes a first light emitting element, a primary lead, a first light receiving element, and a secondary lead. The second body includes a second light emitting element, a primary lead, a second light receiving element, and a secondary lead. The third body includes the first body and the second body. At least one common lead includes the primary leads or the secondary leads, and a portion extending between the first body and the second body, the portion being covered with a first thin film linked to the first body and a second thin film linked to the second body.

14 Claims, 7 Drawing Sheets

SEMICONDUCTOR DEVICE

CROSS-REFERENCE TO RELATED APPLICATIONS

This application is based upon and claims the benefit of priority from Japanese Patent Application No. 2012-062636, filed on Mar. 19, 2012; the entire contents of which are incorporated herein by reference.

FIELD

Embodiments are generally related to a semiconductor device.

BACKGROUND

A photo-coupler is one of the semiconductor devices. The photocoupler includes a light emitting element and a light receiving element, and transmits signals by optical coupling. The photo-coupler has various applications. A dual type photo-coupler includes two pairs of light emitting elements and light receiving elements, and has two transmission channels. This type of photo-coupler needs to suppress inter-channel crosstalk.

In such a device, the two light receiving elements may be bonded to a common lead, and two pairs of light emitting elements and light receiving elements may be molded within a single piece of resin for easing complexity in a fabrication. But the inter-channel crosstalk cannot be suppressed in such case. In another method, each pair of the light emitting element and the light receiving element is molded in an individual resin, and then molded together with a light blocking outer resin. This method may suppress the crosstalk. However, in the first molding step, a deformation may sometimes occurs in the portion of the common lead not sealed with resin. Thus, misalignment between the light emitting element and the light receiving element may be induced by the deformation, resulting in the wiring deformation and the reduction of optical coupling efficiency. Thus, there is demand for a semiconductor device capable of suppressing the inter-channel crosstalk and the misalignment between the light emitting element and the light receiving element, thereby improving the manufacturing yield.

BRIEF DESCRIPTION OF THE DRAWINGS

FIGS. 1A to 2B are schematic views illustrating a semiconductor device according to an embodiment;

FIGS. 4A to 7B are schematic views illustrating manufacturing process of the semiconductor device according to the embodiment.

DETAILED DESCRIPTION

According to an embodiment, a semiconductor device includes a first body molded with a first resin, a second body molded with the first resin, a third body molded with a second resin, the third body including the first body and the second body. The first body includes a first light emitting element, a primary lead electrically connected to the first light emitting element, a first light receiving element sensing light emitted by the first light emitting element, and a secondary lead electrically connected to the first light receiving element. The second body includes a second light emitting element, a primary lead electrically connected to the second light emitting element, a second light receiving element sensing light emitted by the second light emitting element, and a secondary lead electrically connected to the second light receiving element. At least one common lead includes the primary leads of the first body and the second body or the secondary leads of the first body and the second body, and the common lead includes a portion extending between the first body and the second body, the portion being covered with a first thin film linked to the first body and a second thin film linked to the second body.

Embodiments will now be described with reference to the drawings. Like portions in the drawings are labeled with like reference numerals, with the detailed description thereof omitted appropriately, and the different portions are described.

Figure 1A:
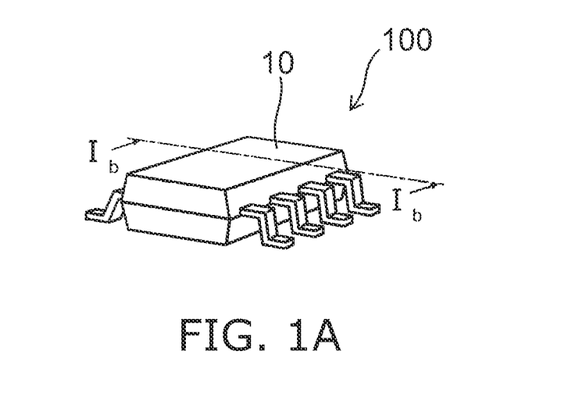
Figure 1B:
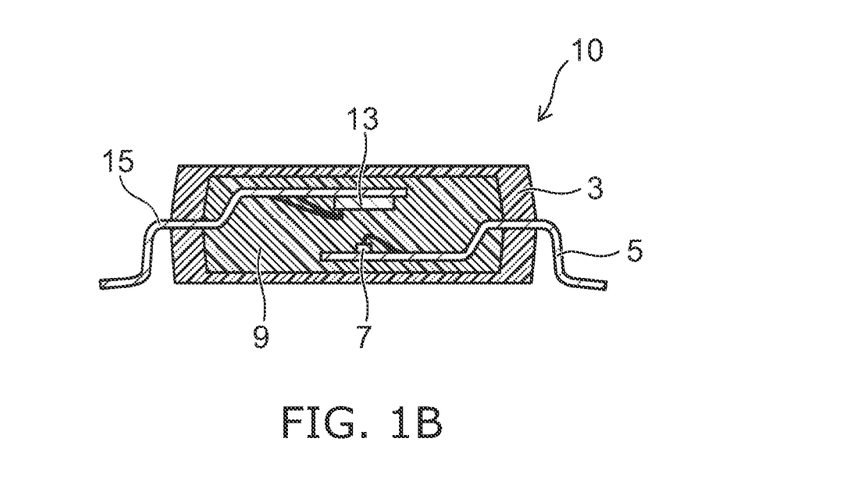

FIGS. 1A and 1B are schematic views showing a semiconductor device 100 according to an embodiment. FIG. 1A is a perspective view showing the appearance of the semiconductor device 100. FIG. 1B is a cross-sectional view taken along line $I_b$-$I_b$ shown in FIG. 1A.

The semiconductor device 100 is e.g. a photo-coupler. As shown in FIG. 1A, the semiconductor device 100 includes a resin package 10 and a plurality of terminals (leads) extending from the resin package 10.

As shown in FIG. 1B, inside the resin package 10, a light emitting element 7 and a light receiving element 13 are incorporated and fixed to the leads 5 and 15 spaced from each other. The light emitting element 7 fixed to the lead 5 and the light receiving element 13 fixed to the lead 15 are opposed to each other. That is, the light emitting surface of the light emitting element 7 and the light receiving surface of the light receiving element 13 are placed opposite to each other. The signal light emitted by the light emitting element 7 is sensed by the light receiving element 13.

The resin package 10 includes an internal mold 9 sealing the light emitting element 7 and the light receiving element 13, and an external mold 3 covering the outside thereof. The internal mold 9 is e.g. a transparent resin. The internal mold 9 transmits light emitted by the light emitting element 7 and causes the light to be incident on the light receiving surface of the light receiving element 13. On the other hand, the external mold 3 is a resin blocking the external light. The external mold 3 suppresses dark current of the light receiving element 13 and reduces the noise level.

The transparent resin used for the internal mold 9 preferably transmits 100% of the light emitted by the light emitting element 7. However, the transparent resin may absorb part of the light. For instance, epoxy resin can be used for the external resin.

The external mold 3 is preferably made of a resin having the same main ingredient as the internal mold 9. This can increase adhesiveness between the internal mold 9 and the external mold 3. The resin forming the external mold 3 includes a material absorbing the external light. For instance, the so-called black resin can be used as the light absorbing material. The black resin is made of epoxy resin dispersed with carbon. Alternatively, the so-called white resin may be used, in which, a material reflecting the external light is dispersed. For instance, epoxy resin dispersed with fine powder of titanium oxide may be used for the external resin. Here, the external light refers to the background light except the light emitted by the light emitting element 7 in the wavelength range, where the light receiving element 13 has sensitivity.

Figure 2A:
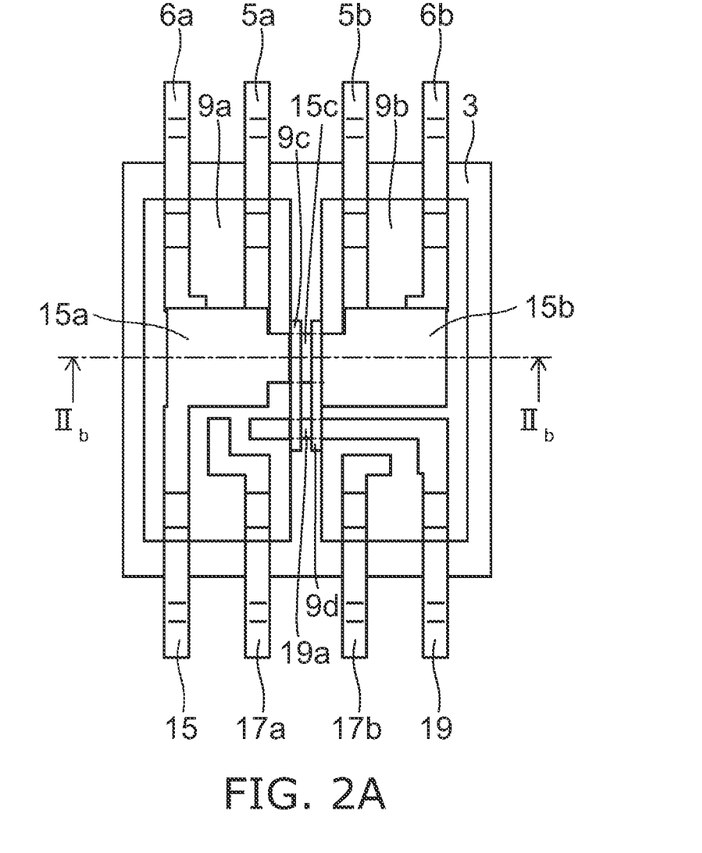
Figure 2B:
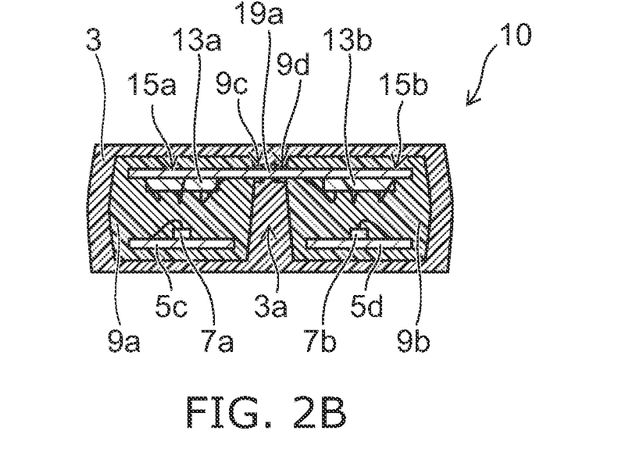

FIG. 2A is a transparent view of the semiconductor device 100 as viewed from above. FIG. 2B is a sectional view taken along line $II_b$-$II_b$ in FIG. 2A. The semiconductor device 100 includes two pairs of light emitting elements 7 and light receiving elements 13, and transmits two channels of signals.

As shown in FIG. 2A, the lead 15 with the light receiving elements 13 fixed thereto includes a first mount portion 15*a* and a second mount portion 15*b* (hereinafter referred to as mount portion 15*a* and mount portion 15*b*). Furthermore, the lead 15 includes a portion linked to the mount portion 15*a* and extending to the outside of the resin package 10. Furthermore, two leads 17*a* and 17*b* are provided for outputting signals detected by the light receiving elements 13. A lead 19 is also provided for supplying electrical power to the light receiving elements 13.

On the other hand, the light emitting elements 7 are fixed to leads 5*a* and 5*b* (see FIG. 3A) opposed to the mount portion 15*a* and the mount portion 15*b*. Furthermore, leads 6*a* and 6*b* are electrically connected to the light emitting elements 7 via metal wires.

Thus, the leads 5*a*, 5*b*, 6*a*, and 6*b* are provided as primary leads for supplying a driving current to the light emitting elements 7. On the other hand, the leads 15, 17*a*, 17*b*, and 19 are provided as secondary leads for outputting signals from the light receiving elements 13 on the secondary side.

The light receiving element 13*a* that serves as a first light receiving element is fixed to the mount portion 15*a* as shown in FIG. 2B. The light receiving element 13*b* that serves as a second light receiving element is fixed to the mount portion 15*b*. On the other hand, the light emitting element 7*a* serving as a first light emitting element is fixed to the mount portion 5*c* linked to the lead 5*a*. The light emitting element 7*b* serving as a second light emitting element is fixed to the mount portion 5*d* linked to the lead 5*b*. The light emitting surface of the light emitting element 7*a* and the light receiving surface of the light receiving element 13*a* are opposed to each other. The light emitting surface of the light emitting element 7*b* and the light receiving surface of the light receiving element 13*b* are opposed to each other.

The light receiving element 13*a* fixed to the mount portion 15*a* and the light emitting element 7*a* fixed to the lead 5*a* are sealed with a first resin in an internal mold 9*a* (a first body). The light receiving element 13*b* fixed to the mount portion 15*b* and the light emitting element 7*b* fixed to the lead 5*b* are sealed with the first resin in an internal mold 9*b* (a second body). The first resin is the transparent resin described above.

The internal molds 9*a* and 9*b* are covered with an external mold 3 (a third body). The external mold 3 is molded with a second resin that has the light blocking property. Furthermore, a shield portion 3*a* is provided between the internal mold 9*a* and the internal mold 9*b*. The shield portion 3*a* shields the light emitted from the light emitting element 7*a* and propagating in the direction to the light receiving element 13*b*, and shields the light from the light emitting element 7*b* that propagates in the direction to the light receiving element 13*a*, thereby suppressing the inter-channel crosstalk.

The lead 15 that is the common lead includes the mount portions 15*a* and 15*b* covered with the internal mold 9*a* and the internal mold 9*b* respectively, and also includes part that is a connecting portion 15*c* extending between the mount portion 15*a* and the mount portion 15*b*. The connecting portion 15*c* is covered with a first thin film 9*c* and a second thin film 9*d* (hereinafter referred to as thin films 9*c* and 9*d*) respectively at the both sides thereof. The first thin film 9*c* and the second thin film 9*d* are made of the same first resin as the internal molds 9*a* and 9*b*. That is, the connecting portion 15*c* is covered with the thin film 9*c* linked to the internal mold 9*a* and the thin film 9*d* linked to the internal mold 9*b*. The connecting portion 15*c* includes a portion covered with the external mold 3 (second resin) between the thin film 9*c* and the thin film 9*d*.

Furthermore, the lead 19 for supplying electrical power to the light receiving elements 13*a* and 13*b* is also a common lead as shown in FIG. 2A. The lead 19 is sealed with the internal molds 9*a* and 9*b* respectively at both sides thereof. The lead 19 includes a portion covered with the internal mold 9*a*, a portion covered with the internal mold 9*b*, and a connecting portion 19*a* extending therebetween. The connecting portion 19*a* is also covered with the thin film 9*c* linked to the internal mold 9*a* and the thin film 9*d* linked to the internal mold 9*b*. The connecting portion 19*a* is also covered with the external mold 3 between the thin film 9*c* and the thin film 9*d*.

In the embodiment, the internal mold 9*a* and the internal mold 9*b* are formed separating from each other between the thin film 9*c* and the thin film 9*d*. The gap therebetween is filled with the second resin having light blocking property. This suppresses propagation of the light emitted from the first light emitting element 7*a* to the internal mold 9*b*, and suppresses propagation of the light emitted from the second light emitting element 7*b* to the internal mold 9*a*. Thus, the crosstalk can be reduced therebetween.

Figure 3A:
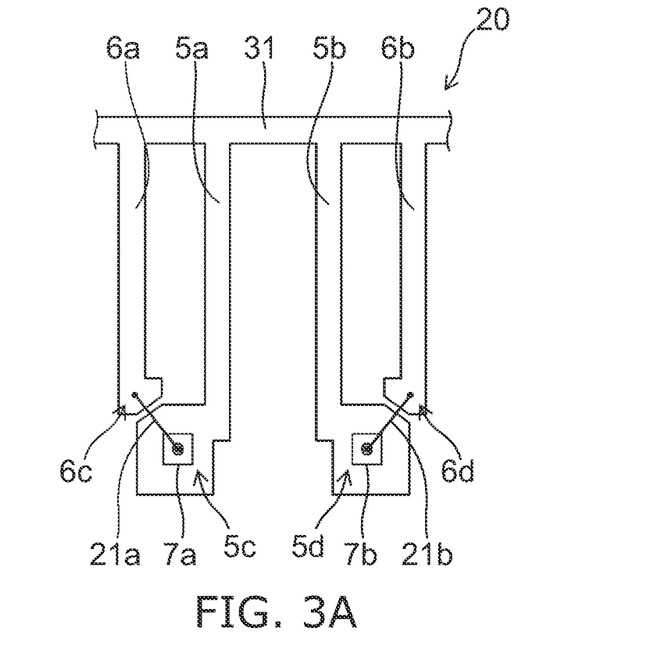
FIGS. 3A and 3B are schematic views illustrating lead frames used for manufacturing the semiconductor device according to the embodiment.

Next, with reference to FIGS. 3A to 7B, a process for manufacturing the semiconductor device 100 is described. FIGS. 3A and 3B are schematic views showing lead frames used to manufacture the semiconductor device 100. FIGS. 4A to 7B are schematic views showing the lead frames in respective steps.

Figure 3B:
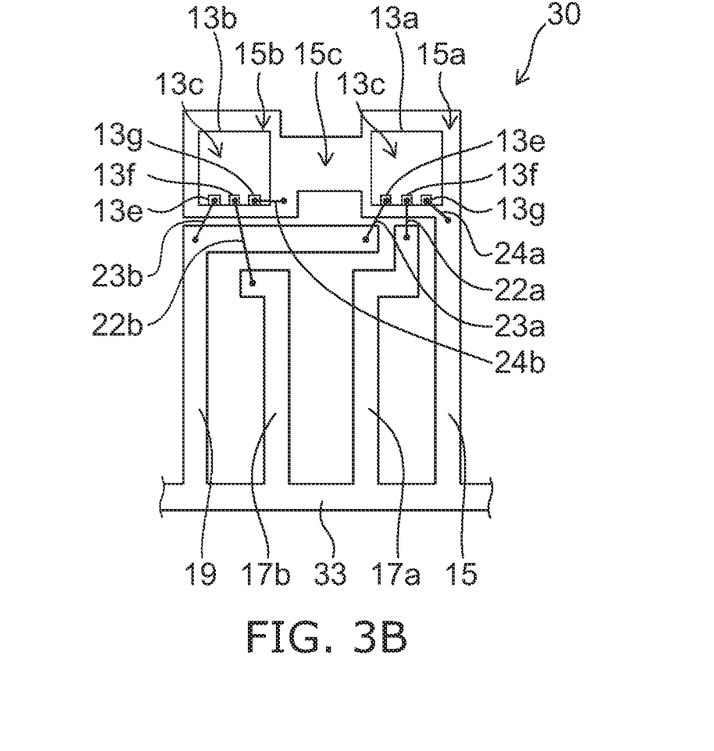

FIG. 3A shows the light emitting elements 7*a* and 7*b* fixed to the lead frame 20 that is a first frame. FIG. 3B shows the state of the light receiving elements 13*a* and 13*b* fixed to the lead frame 30 that is a second frame.

The lead frame 20 shown in FIG. 3A includes leads 5*a*, 5*b*, 6*a*, and 6*b* extending from a common frame 31. A mount portion 5*c* is provided at the tip of the lead 5*a*. The light emitting element 7*a* is fixed to the mount portion 5*c*. The lead 6*a* is electrically connected to the light emitting element 7*a* via a wire 21*a*. On the other hand, a mount portion 5*d* is provided at the tip of the lead 5*b*. The light emitting element 7*b* is fixed to the mount portion 5*d*. The lead 6*b* is electrically connected to the light emitting element 7*b* via a wire 21*b*.

The light emitting elements 7*a* and 7*b* are fixed to the mount portions 5*c* and 5*d*, respectively, via e.g. conductive silver (Ag) paste. The wires 21*a* and 21*b* are e.g. gold (Au) wires. The wires 21*a* is bonded between the light emitting element 7*a* and the tip portion 6*c* of the lead 6*a*, and the wire 21*b* is bonded between the light emitting element 7*b* and the tip portion 6*d* of the lead 6*b*.

The lead frame 30 shown in FIG. 3B includes leads 15, 17*a*, 17*b*, and 19 extending from a common frame 33.

Mount portions 15*a* and 15*b* are provided at the tip of the lead 15. The light receiving element 13*a* is fixed to the mount portion 15*a*. The light receiving element 13*b* is fixed to the mount portion 15*b*. The light receiving elements 13*a* and 13*b* can be fixed via e.g. adhesive resin or Ag paste. In the case where the light receiving elements 13*a* and 13*b* are silicon devices, the light receiving elements 13*a* and 13*b* may be fixed with a silicide layer interposed between the front surface of the lead 15 and the back surface of the light receiving elements 13*a* and 13*b*.

Each of the light receiving elements 13*a* and 13*b* include a light receiving surface 13*c*, a power supply terminal 13*e*, a signal terminal 13*f*, and a ground terminal 13*g*. The power supply terminal 13*e* is connected to the lead 19 via wires 23*a* and 23*b*. The signal terminal 13*f* of the light receiving element 13*a* is connected to the lead 17*a* via a wire 22*a*. The signal terminal 13f of the light receiving element 13b is connected to the lead 17b via a wire 22b. Furthermore, the ground terminals 13g are connected to the lead 15 via wires 24a and 24b respectively. The wires 22-24 are e.g. Au wires.

Figure 4A:
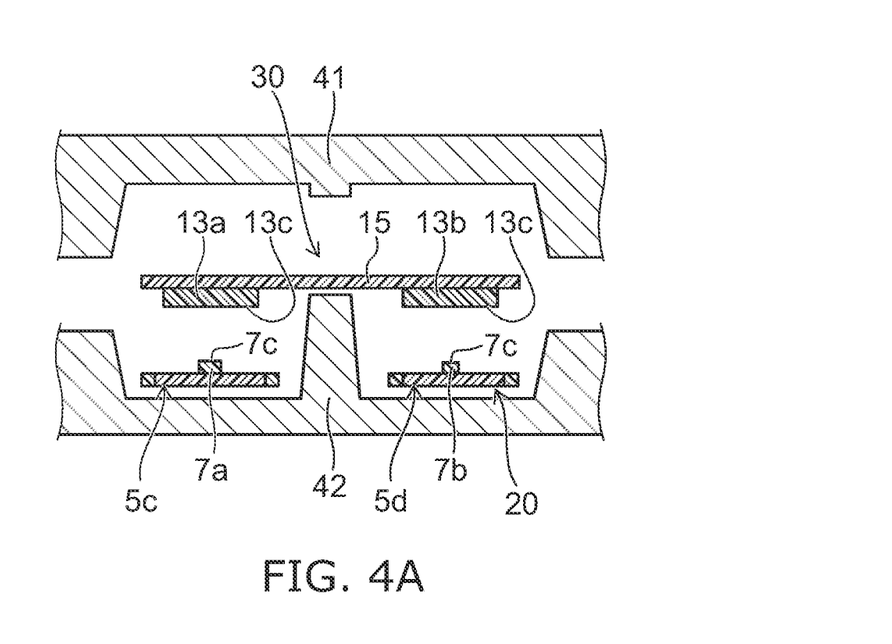
Figure 4B:
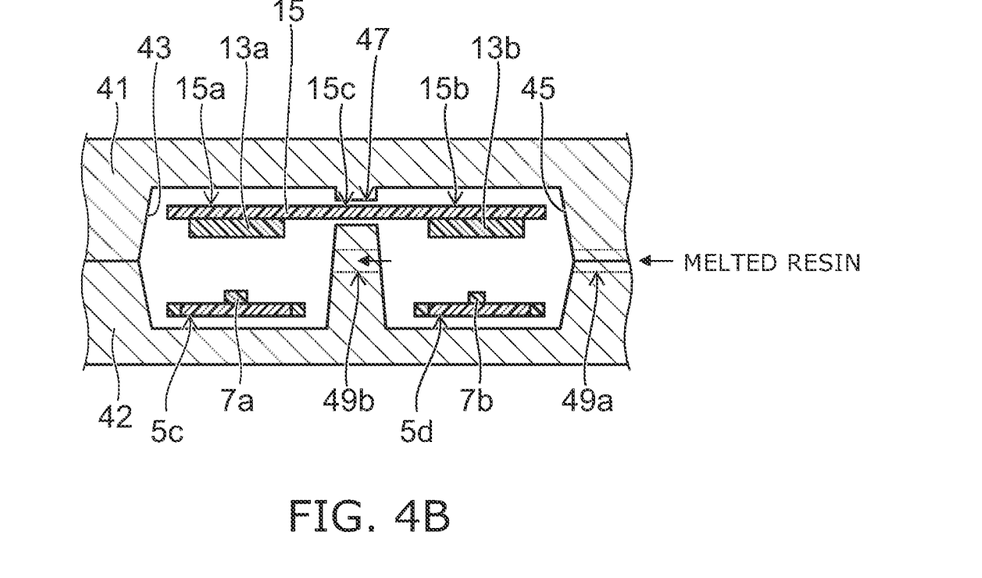

Next, the internal molds 9a and 9b are formed by the molding step shown in FIGS. 4A and 4B. FIG. 4A is a sectional view showing the lead frame 20 and the lead frame 30 stacked and set between an upper die 41 and a lower die 42. FIG. 4B is a sectional view showing the upper die 41 and the lower die 42 being clamped together.

As shown in FIG. 4A, the lead frame 20 and the lead frame 30 are stacked and set on the lower die 42. Here, the light emitting surface 7c of the light emitting element 7a and the light receiving surface 13c of the light receiving element 13a are opposed to each other. The light emitting surface 7c of the light emitting element 7b and the light receiving surface 13c of the light receiving element 13b are opposed to each other.

Next, the upper die 41 and the lower die 42 are clamped to form a first cavity 43 and a second cavity 45. The cavity 43 houses the portion of the lead 5a with the light emitting element 7a fixed thereto, the portion of the lead 6a with the wire 21a bonded thereto, the wire 21a, the mount portion 15a with the light receiving element 13a fixed thereto, the portion of the lead 17a with the wire 22a bonded thereto, the wire 22a, the portion of the lead 19 with the wire 23a bonded thereto, and the wire 23a.

The cavity 45 houses the portion of the lead 5b with the light emitting element 7b fixed thereto, the portion of the lead 6b with the wire 21b bonded thereto, the wire 21b, the mount portion 15b with the light receiving element 13b fixed thereto, the portion of the lead 17b with the wire 22b bonded thereto, the wire 22b, the portion of the lead 19 with the wire 23b bonded thereto, and the wire 23b.

Furthermore, part of the lead 15, that is connecting portion 15c extending between the mount portion 15a and the mount portion 15b, is housed in the gap 47 communicating from the cavity 43 to the cavity 45. Simultaneously, a connecting portion 19a that is part of the lead 19 is also housed in the gap 47. That is, the lead 15 and the lead 19 are common leads covered with both the internal molds 9a and 9b. The portion extending between the internal molds 9a and 9b is housed in the cavity 47.

Next, the first resin in a melted state is injected into the cavity 45 via a runner 49a communicating to the cavity 45. Furthermore, a through gate 49b communicating from the cavity 45 to the cavity 43 is provided in this embodiment. Thus, the first resin injected into the cavity 45 is moved to the cavity 43 and filled into both the cavities 43 and 45. The first resin is also filled into the gap 47 that houses the connecting portions 15c and 19a.

Here, the melted resin could be moved from the cavity 45 to the cavity 43 through the gap 47. However, in order to suppress interchannel crosstalk, the gap 47 may be formed with a narrow spacing, and a thin film-like resin may be molded around the connecting portion 15c. In this case, the resin may fail to smoothly move from the cavity 45 to the cavity 43. Thus, it is preferable to make a through gate 49b for injecting the resin from the cavity 45 into the cavity 43. Furthermore, the runner 49a for injecting the melted resin into the cavity 45 and the through gate 49b are preferably provided at the same height from the bottom surface of the cavities 43 and 45. Furthermore, the runner 49a and the through gate 49b are preferably provided in a line in along the injecting direction of the melted resin.

Next, the resin filled into the cavities 43 and 45 is cured to mold internal molds 9a and 9b. The internal mold 9a is molded inside the cavity 43. The internal mold 9b is molded inside the cavity 45. Furthermore, a thin film 9f is formed on the surface of the connecting portions 15c and 19a.

In the above molding process, the connecting portion 15c between the mount portion 15a and the mount portion 15b, and the connecting portion 19a of the lead 19 are housed in the gap 47. Thus, the connecting portions 15c and 19a are not pressed between the upper die 41 and the lower die 42. This suppresses deformation of the lead 15. Thus, the light receiving elements 13a and 13b can be molded respectively at prescribed positions in the internal molds 9a and 9b. This can suppress misalignment between the light emitting element 7a and the light receiving element 13a, and misalignment between the light emitting element 7b and the light receiving element 13b.

In this embodiment, a die of the so-called through gate type is used. In this type of die, the melted resin moves from the cavity 45 to the cavity 43 through the through gate 49b. The method of injection molding is not limited thereto. For instance, the layout of the runner and the gate can be changed in accordance with the type of the lead frame.

Figure 5A:
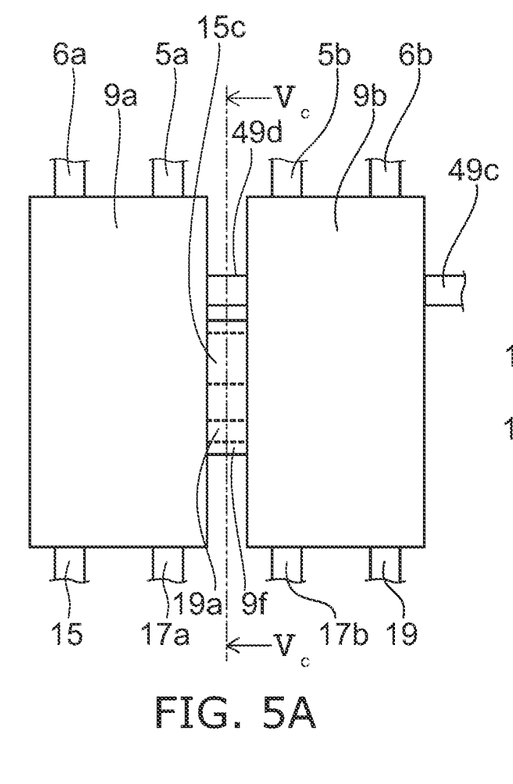
Figure 5B:
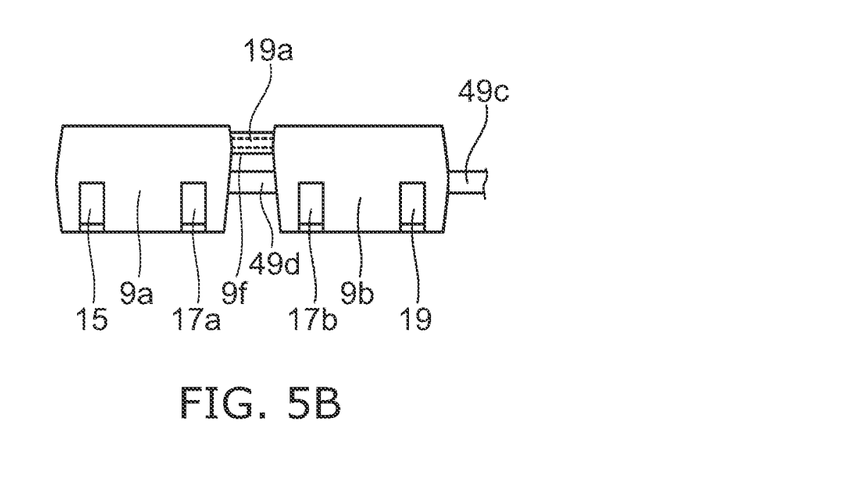
Figure 5C:
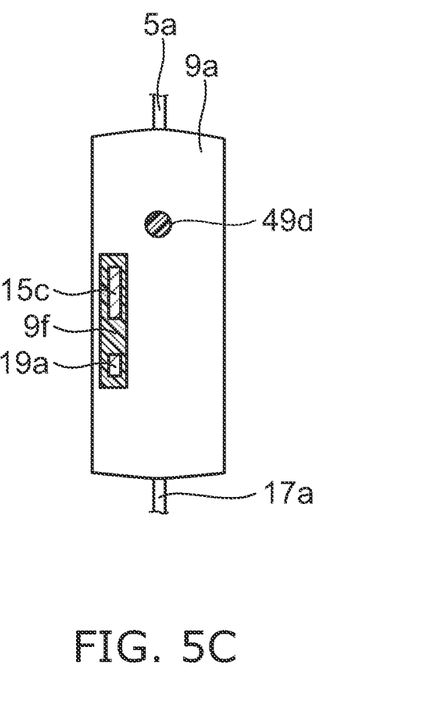

FIGS. 5A to 5C are schematic views showing the internal mold 9a and internal mold 9b after molding mentioned above. FIG. 5A is a plan view. FIG. 5B is a front view. FIG. 5C is a sectional view taken long line $V_c$-$V_c$.

The leads 5a, 6a, 15, and 17a extend from the internal mold 9a as shown in FIGS. 5A to 5C. The leads 5b, 6b, 17b, and 19 extend from the internal mold 9b. The connecting portion 15c and the connecting portion 19a covered with the thin film 9f are interposed between the internal mold 9a and the internal mold 9b. Furthermore, a runner resin portion 49c and a through gate resin portion 49d filled into the runner 49a and the through gate 49b are also formed.

Next, the first resin formed around the internal molds 9a and 9b and therebetween is removed. For instance, a punching edge adapted to the outline of the internal molds 9a and 9b is used for removing the excess resin therearound. Thus, the runner resin portion 49c and the through gate resin portion 49d formed in the runner 49a and the through gate 49b, and burrs and the like formed by molding are removed. Accordingly, the excess resin can be removed between the internal mold 9a and the internal mold 9b, leaving the thin film 9f covering the connecting portions 15c and 19a.

Figure 6A:
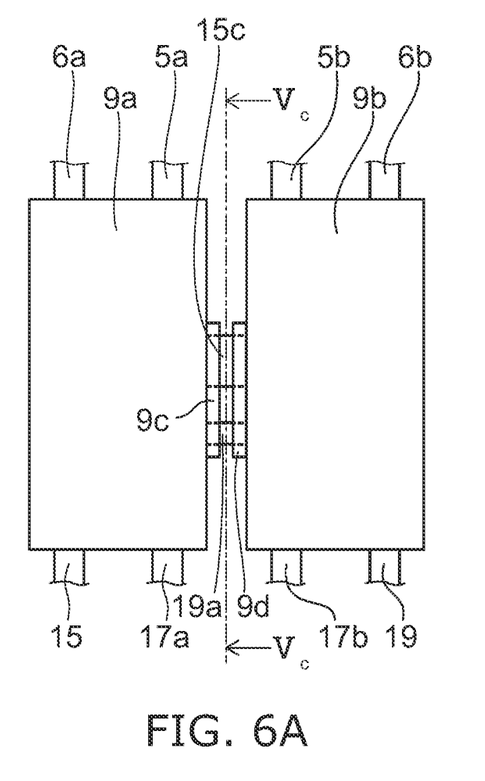
Figure 6B:
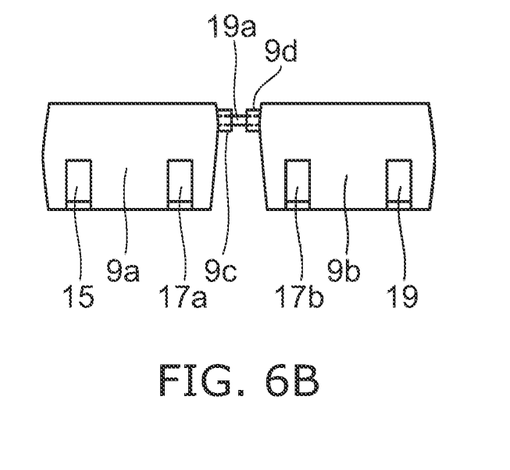
Figure 6C:
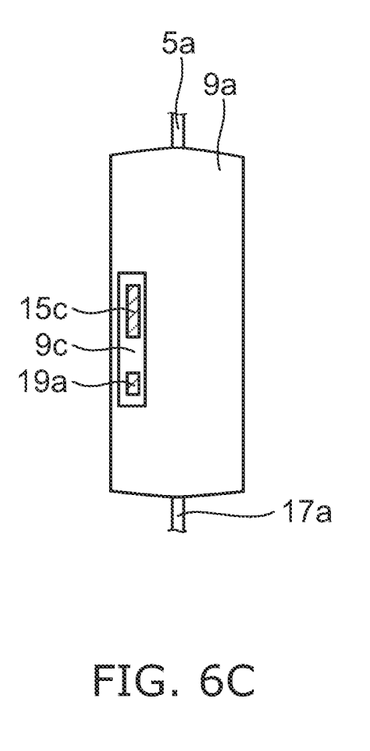

FIGS. 6A to 6C are schematic views showing the internal mold 9a and the internal mold 9b after removing the runner resin portion and burrs. FIG. 6A is a plan view. FIG. 6B is a front view. FIG. 6C is a sectional view taken long line $V_c$-$V_c$.

In this embodiment, a central portion of the thin film 9f covering the connecting portions 15c and 19a is removed as shown in FIGS. 6A to 6C. Thus, the thin film 9f is separated into a thin film 9c linked to the internal mold 9a and a thin film 9d linked to the internal mold 9b.

For instance, the central portion of the thin film 9f is irradiated with laser light to locally heat the first resin. Then, the laser light is scanned along the side surface of the internal molds 9a and 9b. Thus, the first resin can be removed leaving the connecting portions 15c and 19a.

Figure 7A:
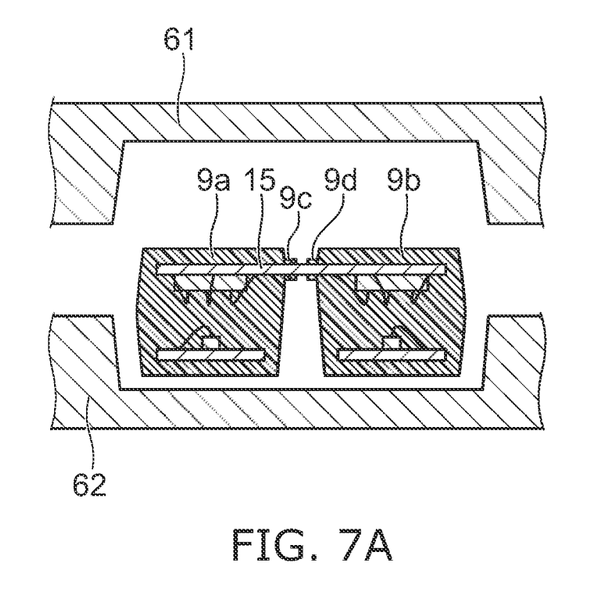
Figure 7B:
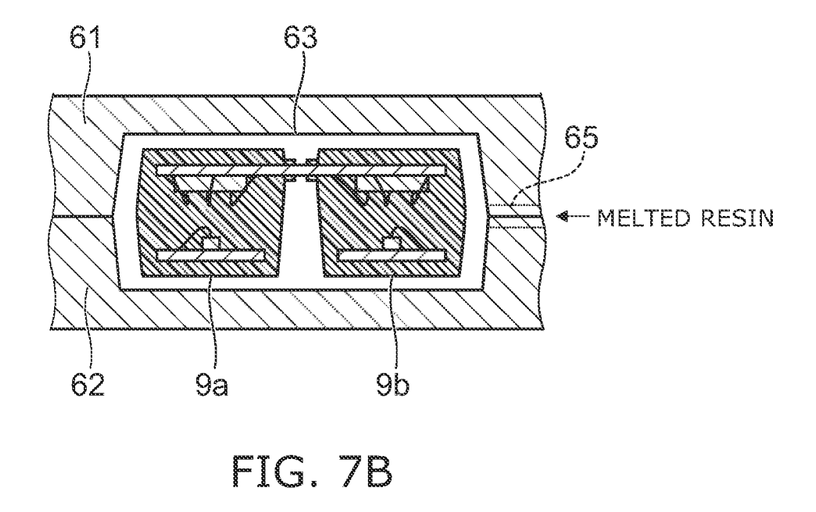

Next, an external mold 3 covering the internal mold 9a, the internal mold 9b, and the connecting portions 15c and 19a is molded by the molding process shown in FIGS. 7A and 7B.

As shown in FIG. 7A, the lead frames 20 and 30 with the internal molds 9a and 9b formed thereon are set on a lower die 62. Next, an upper die 61 and the lower die 62 are clamped together to form a cavity 63 as shown in FIG. 7B.

Next, the second resin in the melted state is injected via a runner 65 communicating to the cavity 63. Then, the resin filled into the cavity 63 is cured to mold an external mold 3. The external mold 3 covers the internal molds 9a and 9b, the thin film 9c, the thin film 9d, and the connecting portions 15c and 19a exposed between the thin films 9c and 9d. Next, the lead frames 20 and 30 with the external mold 3 molded thereon is taken out of the die. The common frames 31 and 33 are cut for separation into individual semiconductor devices 100.

In the above manufacturing process, the first molding is advantageously performed preventing the deformation of the common leads 15 and 19, since the connecting portions 15c and 19a are housed in the gap 47 and not directly clumped between the dies. Thereby, it becomes possible to suppress the misalignment between the light emitting element 7a and the light receiving element 13a, and misalignment between the light emitting element 7b and the light receiving element 13b. Furthermore, the first resin is e.g. a hard epoxy resin. Thus, the strength of the connecting portions 15c and 19a covered with the thin film 9f can be increased. This can suppress deformation of the lead frames 20 and 30 with the internal molds 9a and 9b molded thereon in the following process.

The second resin having light blocking property is molded between the first thin film 9c and the second thin film 9d. This can reliably suppress the crosstalk between the internal mold 9a and the internal mold 9b.

In the above embodiment, for instance, the first light receiving element 13a and the second light receiving element 13b are mounted on a common lead. However, the first light emitting element 7a and the second light emitting element 7b may be mounted on a common lead. Common leads may be provided on both the light receiving section side and the light emitting section side. Furthermore, a dual channel photo-coupler is illustrated in the above embodiment. However, the embodiment is not limited thereto. The number of optical channels is arbitrary. The photo-coupler may have a structure including three or more channels.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
    a first body molded with a first resin, the first body including a first light emitting element, a first primary lead electrically connected to the first light emitting element, a first light receiving element positioned to receive light emitted by the first light emitting element, and a first secondary lead electrically connected to the first light receiving element;
    a second body molded with the first resin, the second body including a second light emitting element, a second primary lead electrically connected to the second light emitting element, a second light receiving element positioned to receive light emitted by the second light emitting element, and a second secondary lead electrically connected to the second light receiving element; and
    a third body molded with a second resin, the third body including the first body and the second body;
    at least one common lead electrically connected to the first and second primary leads or the first and second secondary leads, and
    wherein the at least one common lead includes a portion extending between the first body and the second body, the portion extending between the first body and the second body including a first portion covered with a first thin film that is linked to the first body and a second portion covered with a second thin film that is linked to the second body.

2. The device according to claim 1, wherein
    a light emitting surface of the first light emitting element faces a light receiving surface of the first light receiving element, and
    a light emitting surface of the second light emitting element faces a light receiving surface of the second light receiving element.

3. The device according to claim 1, wherein the third body covers the first thin film, the second thin film, and a portion of the common lead that is exposed between the first thin film and the second thin film.

4. The device according to claim 1, wherein the third body includes a light blocking portion provided between the first body and the second body.

5. The device according to claim 1, wherein the first resin and the second resin comprise a main ingredient that is the same, and the second resin further comprises an additive that is not included in the first resin.

6. The device according to claim 1, wherein a main ingredient of the first resin and a main ingredient of the second resin are each epoxy resin.

7. The device according to claim 1, wherein the first resin transmits light emitted by the first light emitting element and light emitted by the second light emitting element, and the second resin blocks external light, light emitted from the first light emitting element, and light emitted from the second light emitting element.

8. The device according to claim 7, wherein the second resin includes a light absorbing material.

9. The device according to claim 7, wherein the second resin includes a light reflecting material.

10. The device according to claim 1, wherein the at least one common lead electrically connects the first secondary lead and the second secondary lead and the first secondary lead includes a first mount portion and the second secondary lead includes a second mount portion, the first light receiving element is mounted on the first mount portion, and the second light receiving element is mounted on the second mount portion.

11. The device according to claim 10, further comprising a second common lead including a portion extending between the first body and the second body, wherein the second common lead supplies electrical power to the first light receiving element and the second light receiving element.

12. The device according to claim 1, wherein
    the first secondary lead outputs a signal detected by the first light receiving element, and
    the second secondary lead outputs a signal detected by the second light receiving element.

13. The device according to claim 8, wherein the light absorbing material is an epoxy resin dispersed with carbon.

14. The device according to claim 9, wherein the light reflecting material is an epoxy resin dispersed with titanium oxide.

* * * * *